United States Patent
Shibata

(10) Patent No.: US 9,007,148 B2
(45) Date of Patent: Apr. 14, 2015

(54) COMMON MODE FILTER PROVIDED WITH HIGHTENED REMOVAL FUNCTION OF COMMON MODE NOISE AND DE-EMPHASIS FUNCTION

(71) Applicant: Panasonic Intellectual Property Management Co., Ltd., Osaka (JP)

(72) Inventor: Osamu Shibata, Hyogo (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 13/916,953

(22) Filed: Jun. 13, 2013

(65) Prior Publication Data

US 2013/0278355 A1     Oct. 24, 2013

Related U.S. Application Data

(63) Continuation of application No. PCT/JP2012/006103, filed on Sep. 25, 2012.

(30) Foreign Application Priority Data

Nov. 15, 2011   (JP) .................................. 2011-249492

(51) Int. Cl.
*H03H 7/01*     (2006.01)
*H04B 3/28*     (2006.01)
(Continued)

(52) U.S. Cl.
CPC ............. *H03H 7/0138* (2013.01); *H03H 7/427* (2013.01); *H04B 3/28* (2013.01); *H03H 7/0153* (2013.01); *H03H 7/06* (2013.01); *H03H 7/1708* (2013.01)

(58) Field of Classification Search
CPC ......... H03H 7/0138; H03H 7/427; H04B 3/28
USPC ....................................... 333/4, 12, 172, 181
See application file for complete search history.

(56) References Cited

U.S. PATENT DOCUMENTS

| 6,097,262 A * | 8/2000 | Combellack ................... 333/12 |
| 6,992,537 B2 | 1/2006 | Yasui et al. |
| 2004/0155720 A1 | 8/2004 | Yasui et al. |

FOREIGN PATENT DOCUMENTS

| JP | 02-288429 | 11/1990 |
| JP | 2003-078378 | 3/2003 |

(Continued)

OTHER PUBLICATIONS

International Search Report mailed Jan. 15, 2013 in International (PCT) Application No. PCT/JP2012/006103.

(Continued)

*Primary Examiner* — Benny Lee
*Assistant Examiner* — Rakesh Patel
(74) *Attorney, Agent, or Firm* — Wenderoth, Lind & Ponack, L.L.P.

(57) ABSTRACT

In a common mode filter, at least one common mode filter portion is provided for removing a common mode noise, and has a first terminal pair configured to include first and second terminals connected to first and second external terminals, respectively, and has a second terminal pair configured to include third and fourth terminals connected to third and fourth external terminals, respectively. The filter includes an inductor circuit including at least two inductors that are connected in parallel to the first terminal pair of the common mode filter portion and are connected in series to each other, and an external terminal connected to the connection point of the at least two inductors. The external terminal is for being directly or indirectly grounded.

2 Claims, 17 Drawing Sheets

(51) Int. Cl.
*H03H 7/42* (2006.01)
*H03H 7/06* (2006.01)

(56) References Cited

FOREIGN PATENT DOCUMENTS

| JP | 2003-224020 | 8/2003 |
| JP | 2005-244351 | 9/2005 |
| JP | 2005-347916 | 12/2005 |
| JP | 2010-027951 | 2/2010 |
| WO | 2004/062220 | 7/2004 |

OTHER PUBLICATIONS

International Preliminary Report on Patentability and Written Opinion of the International Searching Authority issued May 30, 2014 in International (PCT) Application No. PCT/JP2012/006103.

* cited by examiner

US 9,007,148 B2

COMMON MODE FILTER PROVIDED WITH HIGHTENED REMOVAL FUNCTION OF COMMON MODE NOISE AND DE-EMPHASIS FUNCTION

CROSS-REFERENCE TO RELATED APPLICATIONS

This is a continuation application of PCT application No. PCT/JP2012/006103, with an international filing date of Sep. 25, 2012, which claims priority of Japanese patent application No. JP 2011-249492 as filed Nov. 15, 2011, the contents of which are incorporated herein by reference.

BACKGROUND OF THE INVENTION

1. Technical Field

The present disclosure relates to a common mode filter, and relates, in particular, to improve removal capability of the common mode noise, impedance matching and so on with acquiring a de-emphasis function in a common mode filter having an inductor, a capacitor and a resistor.

2. Description of the Related Art

In recent years, high-speed serial interfaces such as HDMI (High Definition Multi-media Interface) and USB (Universal Serial Bus) have been widely popularized in accordance with increases in data amount. The high-speed serial interfaces adopt differential transmission technologies from the viewpoint of speedup, high noise immunity and noise reduction, and common mode filters are widely used as noise suppression parts in order to further promote high noise immunity and noise reduction when the interfaces are incorporated into set systems and the like.

As the features of common mode filters, there can be enumerated differential transmission characteristics (giving no influence on differential transmission waveforms) of which the high-frequency characteristics for speedup are improved, and impedance matching characteristics matched to differential transmission lines based on common mode noise removal capabilities.

Conventionally, a common mode filter configuration having a terminator circuit as shown in a Patent Document 1 of Japanese patent laid-open publication No. JP 2010-27951 A is proposed as a technology to improve the common mode noise removal capabilities of common mode filters.

SUMMARY

The above-mentioned configuration has such a problem that it is inappropriate for speedup since it does not achieve impedance matching since the line behind the common mode filter is viewed as a stub. Moreover, the differential transmission characteristics are merely considered to give less influence on the differential transmission waveforms as far as possible, and have no function to deliberately compensate for the attenuation and the group phase characteristics of the transmission line of a cable and so on.

One non-limiting and exemplary embodiment provides a common mode filter capable of remarkably improving removal capability of the common mode noise with an equalizing function to correct the differential transmission waveforms, and achieving impedance matching that reduces influence on the transmission waveforms.

Additional benefits and advantages of the disclosed embodiments will be apparent from the specification and Figures. The benefits and/or advantages may be individually provided in the various embodiments and features of the specification and drawings disclosures, and need not all be provided in order to obtain one or more of the same.

In one general aspect, the techniques disclosed here feature: there is provided a common mode filter including at least one common mode filter portion configured to remove a common mode noise, and the at least one common mode filter portion has a first terminal pair configured to include first and second terminals connected to first and second external terminals, respectively, and has a second terminal pair configured to include third and fourth terminals connected to third and fourth external terminals, respectively.

The common mode filter further includes an inductor circuit, a fifth external terminal, first and second capacitors, and first and second resistors.

The inductor circuit includes at least first and second inductors that are connected in parallel to the first terminal pair of the common mode filter portion and are connected in series to each other. The fifth external terminal is connected to a connection point of the first and second inductors. The first capacitor is inserted between the first external terminal and the first terminal of the common mode filter portion. The second capacitor is inserted between the second external terminal and the second terminal of the common mode filter portion. The first resistor is inserted between the first terminal of the common mode filter portion and one end of the first inductor or between a connection point of the first and second inductors and the other end of the first inductor. The second resistor is inserted between the second terminal of the common mode filter portion and one end of the second inductor or between a connection point of the first and second inductors and the other end of the second inductor. The fifth external terminal is for being directly or indirectly grounded.

Accordingly, since the common mode filter of the present disclosure having the external terminal for being grounded, the common mode filter forms a path through which the common mode component escapes, and becomes able to further improve removal capability of the common mode noise in the low region in addition to the equalizing function.

BRIEF DESCRIPTION OF THE DRAWINGS

These and other objects and features of the present disclosure will become clear from the following description taken in conjunction with the embodiments thereof with reference to the accompanying drawings throughout which like parts are designated by like reference numerals, and in which.

DETAILED DESCRIPTION

Figure 1:
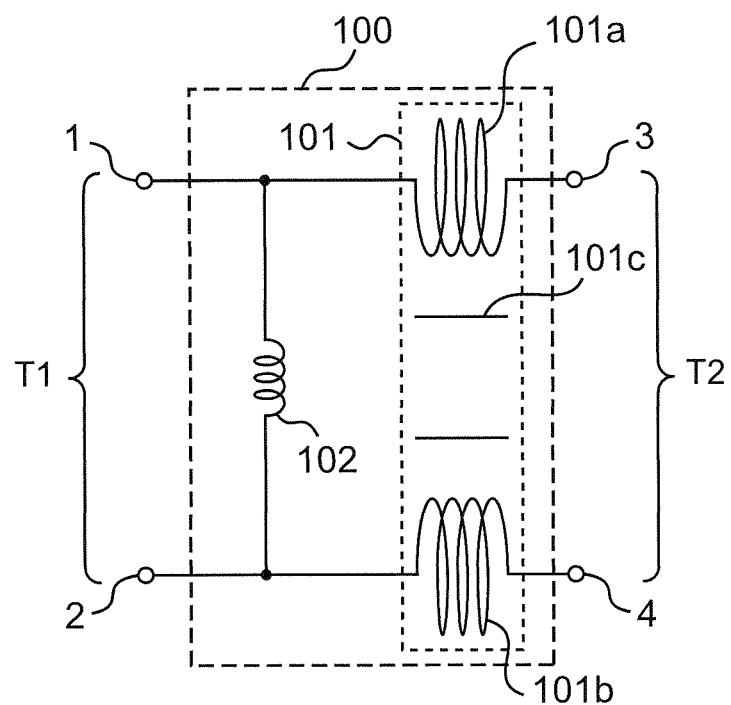
FIG. 1 is a circuit diagram showing a configuration of a common mode filter 100 according to a first embodiment of the present disclosure.

Embodiments according to the present disclosure will be described below with reference to the drawings. In the following embodiments, like components are denoted by like reference numerals. Moreover, in the following embodiments, common mode filters for an 8B10B coded signal are described in principle, and a common mode filter for a 64B66B coded signal is described as an exception only in FIGS. 6, 18A and 18B of a sixth embodiment.

First Embodiment

FIG. 1 is a circuit diagram showing a configuration of a common mode filter 100 according to the first embodiment of the present disclosure. Referring to FIG. 1, the common mode filter 100 with an equalizing function of the present embodiment is configured to include a common mode filter portion 101 and an inductor 102. In the common mode filter 100, the common mode filter portion 101 is configured to include a pair of coils 101a and 101b wound around a predetermined core or magnetic core 101c. An inductor 102 is connected in parallel to the tee urinal pair on one side of them, and the first and second terminals of the terminal pair on the one side are connected to external terminals 1 and 2, respectively, (hereinafter, referred to as an external terminal pair T1), and third and fourth terminals of the other terminal pair are connected to external terminals 3 and 4, respectively, (hereinafter, referred to as an external terminal pair T2).

Figure 12A:
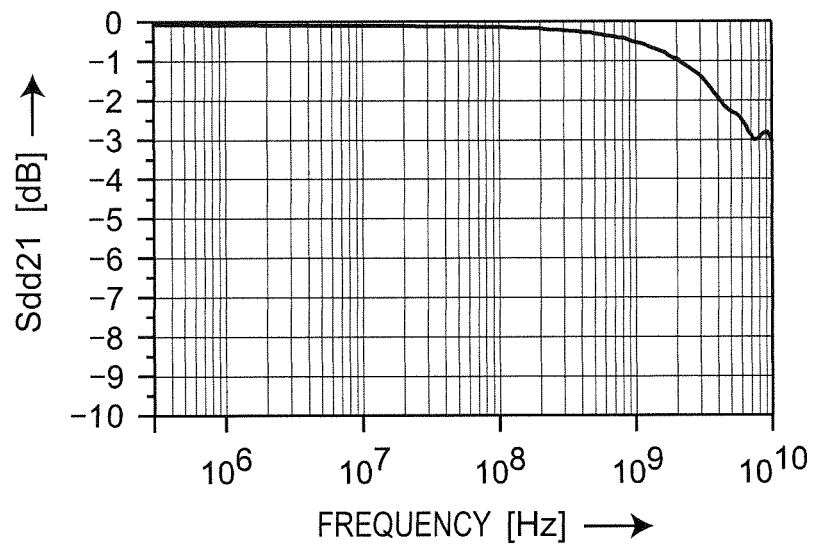
FIG. 12A is a spectral graph showing a frequency characteristic of a differential mode transmission coefficient Sdd21 of a prior art common mode filter.
Figure 12B:
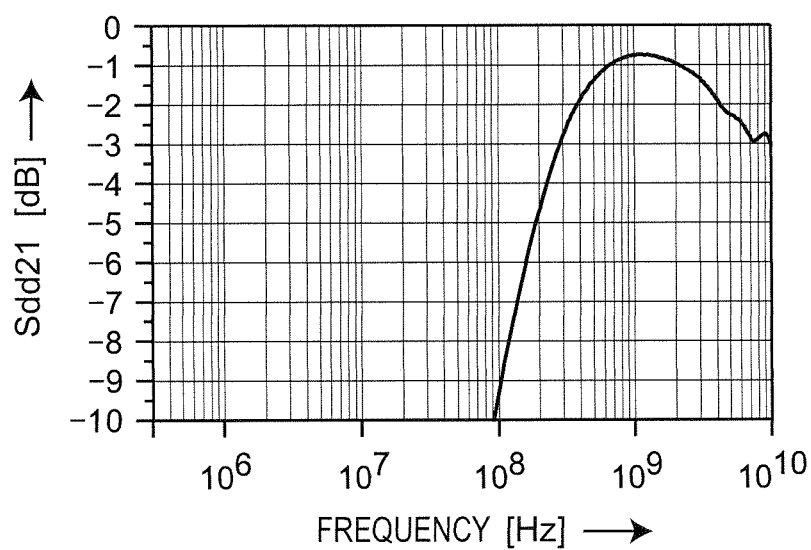
FIG. 12B is a spectral graph showing a frequency characteristic of the differential mode transmission coefficient Sdd21 of the common mode filter 100 of FIG. 1.

FIG. 12A is a spectral graph showing a frequency characteristic of the differential mode transmission coefficient Sdd21 of the prior art common mode filter (only the common mode filter portion 101), and FIG. 12B is a spectral graph showing a frequency characteristic of the differential mode transmission coefficient Sdd21 of the common mode filter 100 of FIG. 1. As apparent from FIG. 12B, a de-emphasis characteristic such that the characteristic at a frequency equal to or lower than 1.5 GHz is gradually attenuated (−7 dB at 300 MHz, −1 dB at 1.5 GHz) can be obtained. When a 3-Gbps data bit string that is the 8B10B coded signal used generally in the serial interface is transmitted by a 10-m cable in the case of such a characteristic, the frequency components at or below the fundamental frequency included in the data bit string range from 300 to 1.5 GHz down to one-fifth. Attenuation is little in the case of the data patterns of "0" and "1" of swift changes, and the attenuation increases in the case of the data patterns of "0000011111" and the like of moderate changes, making it possible to ease the interference between symbols in the transmission cable.

Figure 13A:
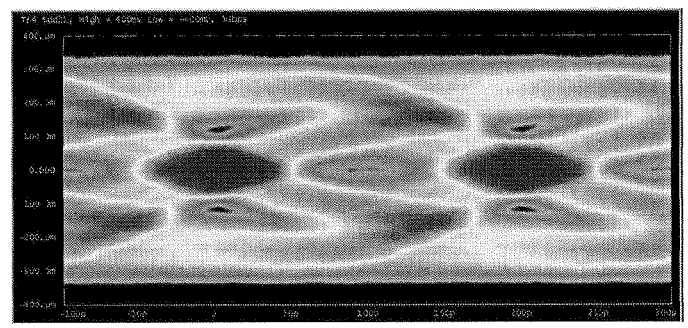
FIG. 13A is a chart showing one eye pattern example of the output signal of the prior art common mode filter.
Figure 13B:
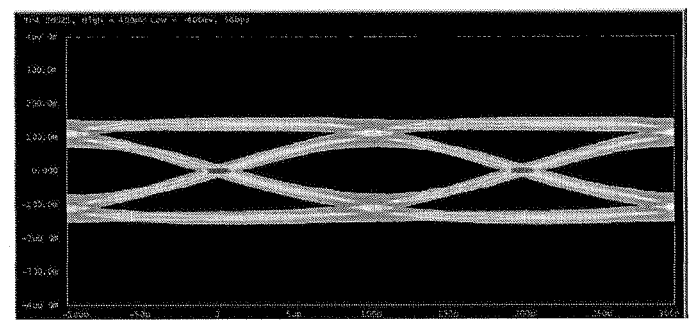
FIG. 13B is a chart showing one eye pattern example of the output signal of the common mode filter 100 of FIG. 1.

FIG. 13A is chart showing one eye pattern example of the output signal of the prior art common mode filter, and FIG. 13B is a chart showing one eye pattern example of the output signal of the common mode filter 100 of FIG. 1. As apparent from FIG. 13A, it can be understood that the eye pattern is closed in the prior art example, while the eye pattern is opened by waveform level correction (equalizing function) called de-emphasis in the present embodiment.

As described above, according to the present embodiment, it is possible to effect the waveform level correction (equalizing function) called de-emphasis on the differential signal instead of the high-speed differential signal transmitted simply, and this can help high-speed transmission, allowing the bit error rate to be remarkably ameliorated.

Although the above embodiment is configured to include one common mode filter portion 101 and one inductor 102, the present disclosure is not limited to this, and it is beneficial to provide a plurality of common mode filter portions 101 and inductors 102 connected in parallel or series to each other. Moreover, the constants of them may be changed.

Second Embodiment

Figure 2:
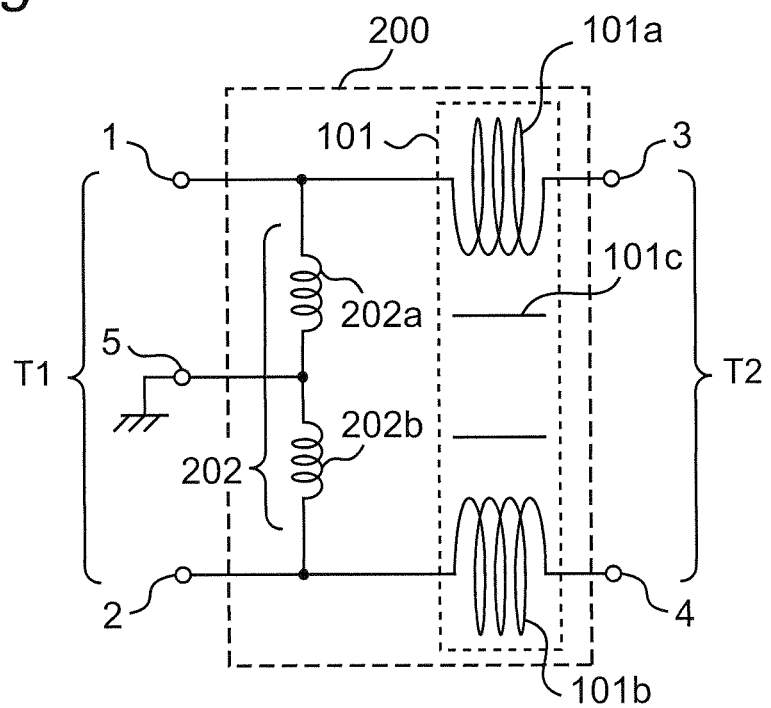
FIG. 2 is a circuit diagram showing a configuration of a common mode filter 200 according to a second embodiment of the present disclosure.

FIG. 2 is a circuit diagram showing a configuration of a common mode filter 200 according to the second embodiment of the present disclosure. Referring to FIG. 2, the common mode filter 200 of the present embodiment is characterized in that the inductor 102 is divided into two inductors 202a and 202b, and a grounded external terminal 5 is connected to the connection point of them as compared with the common mode filter 100 of the first embodiment of FIG. 1. In this case, a series circuit of the two inductors 202a and 202b is hereinafter referred to as an inductor circuit 202.

Figure 14A:
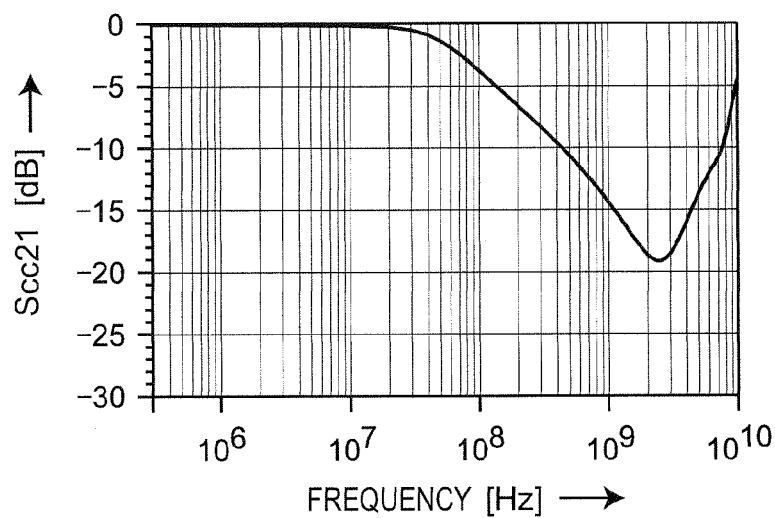
FIG. 14A is a spectral graph showing a frequency characteristic of a common mode transmission coefficient Scc21 of the prior art common mode filter.
Figure 14B:
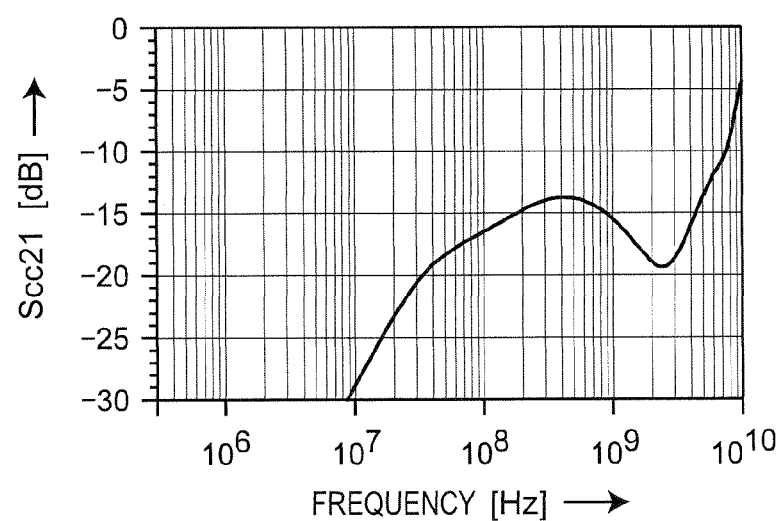
FIG. 14B is a spectral graph showing a frequency characteristic of the common mode transmission coefficient Scc21 of the common mode filter 200 of FIG. 2.

FIG. 14A is a spectral graph showing a frequency characteristic of the common mode transmission coefficient Scc21 of the prior art common mode filter, and FIG. 14B is a spectral graph showing a frequency characteristic of the common mode transmission coefficient Scc21 of the common mode filter 200 of FIG. 2. As apparent from FIG. 14B, it can be understood that the noises at a frequency equal to or lower than 500 MHz can be markedly removed in the present embodiment as compared with FIG. 14A.

As described above, according to the present embodiment, by virtue of the formed path through which the common mode components escape due to grounding via the external terminal 5, it is possible to further improve removal capability of the common mode noise in the low region in addition to the equalizing function.

Although the external terminal 5 is directly grounded in the above embodiment, the present disclosure is not limited to this, and the terminal may be indirectly grounded in the following manner of (1) grounding the external terminal 5 via a resistor,
(2) grounding the external terminal 5 via an inductor,
(3) grounding the external terminal 5 via a capacitor, or
(4) grounding the external terminal 5 to a predetermined power supply.

Although the above embodiment is configured to include one common mode filter portion 101 and two inductors 102, the present disclosure is not limited to this, and it is beneficial to provide a plurality set of the common mode filter portion 101 and the inductor 102 connected in parallel or series to each other. Moreover, the constants of them may be changed.

Third Embodiment

Figure 3:
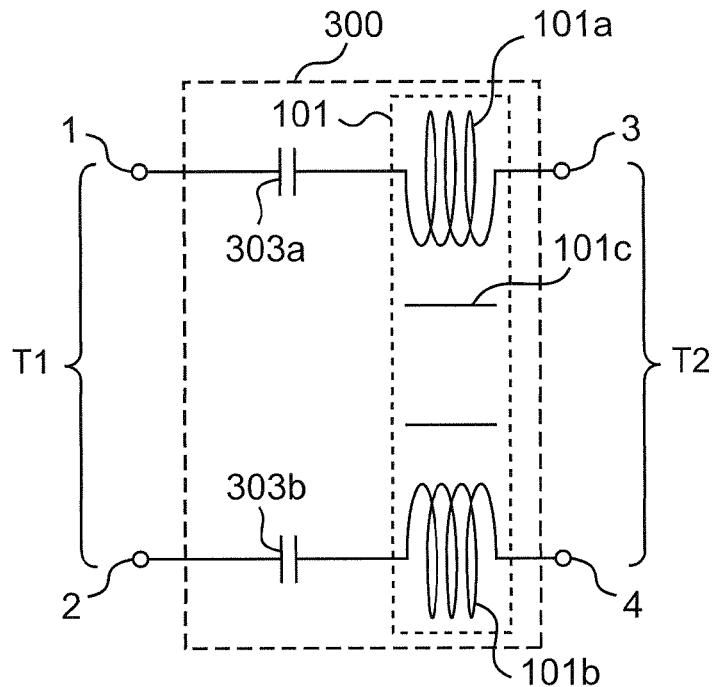
FIG. 3 is a circuit diagram showing a configuration of a common mode filter 300 according to a third embodiment of the present disclosure.

FIG. 3 is a circuit diagram showing a configuration of a common mode filter 300 according to the third embodiment of the present disclosure. Referring to FIG. 3, as compared with the common mode filter 100 of the first embodiment of FIG. 1, the common mode filter 300 of the present embodiment is characterized in that, in place of the inductor 102, (1) a capacitor 303a is inserted between the external terminal 1 and one end of the coil 101a of the common mode filter portion 101, and
(2) a capacitor 303b is inserted between the external terminal 2 and one end of the coil 101b of the common mode filter portion 101.

Figure 15A:
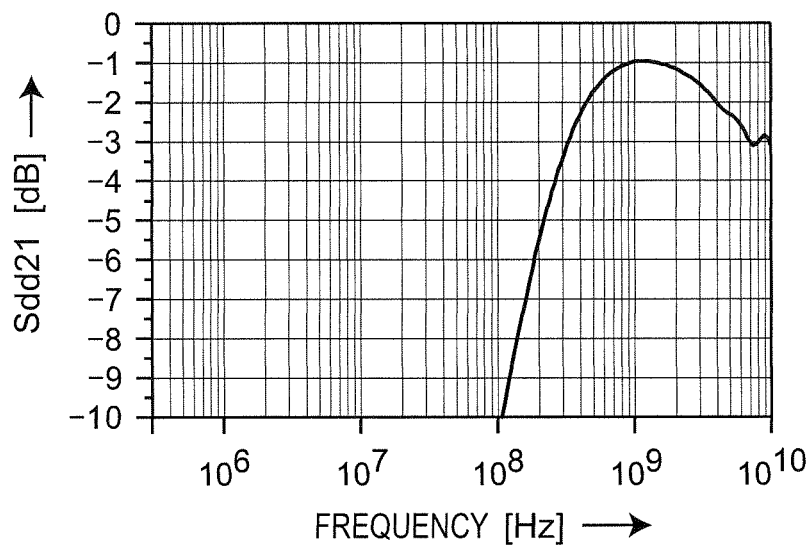
FIG. 15A is a spectral graph showing a frequency characteristic of the differential mode transmission coefficient Sdd21 of the common mode filter 300 of FIG. 3.
Figure 15B:
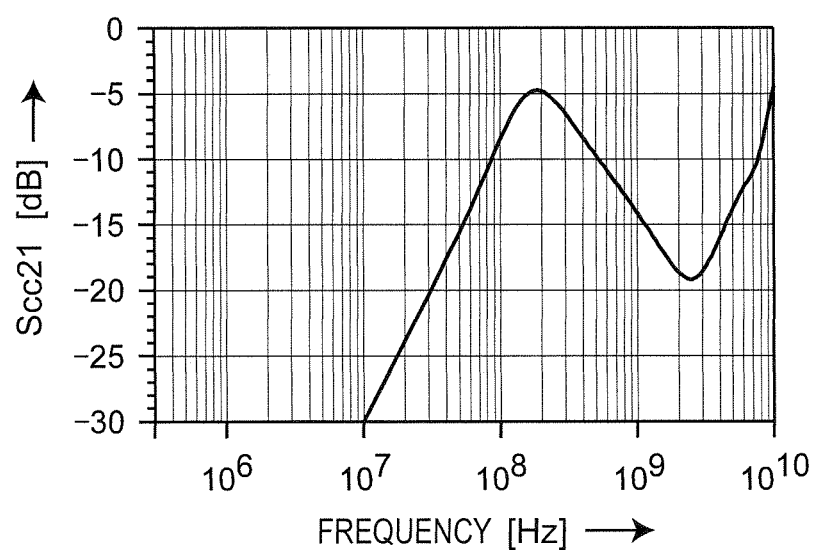
FIG. 15B is a spectral graph showing a frequency characteristic of the common mode transmission coefficient Scc21 of the common mode filter 300 of FIG. 3.

FIG. 15A is a spectral graph showing a frequency characteristic of the differential mode transmission coefficient Sdd21 of the common mode filter 300 of FIG. 3, and FIG. 15B is a spectral graph showing a frequency characteristic of the common mode transmission coefficient Scc21 of the common mode filter 300 of FIG. 3. In contrast to the fact that the de-emphasis effect and removal capability of the common mode noise are obtained by grounding the connection point of the two inductors 202a and 202b in the second embodiment of FIG. 2, the present embodiment can produce a similar effect merely by adding two capacitors 303a and 303b.

As described above, according to the present embodiment, the equalizing function and the effect of improving removal capability of the common mode noise in the low region can be concurrently obtained, and it is possible to cut off the DC component.

Although the above embodiment is configured to include one common mode filter portion 101 and the two capacitors 303a and 303b, the present disclosure is not limited to this, and it is beneficial to provide a plurality set of the common mode filter portion 101 and the two capacitors 303a and 303b connected in parallel or series to each other. Moreover, the constants of them may be changed.

Fourth Embodiment

Figure 4:
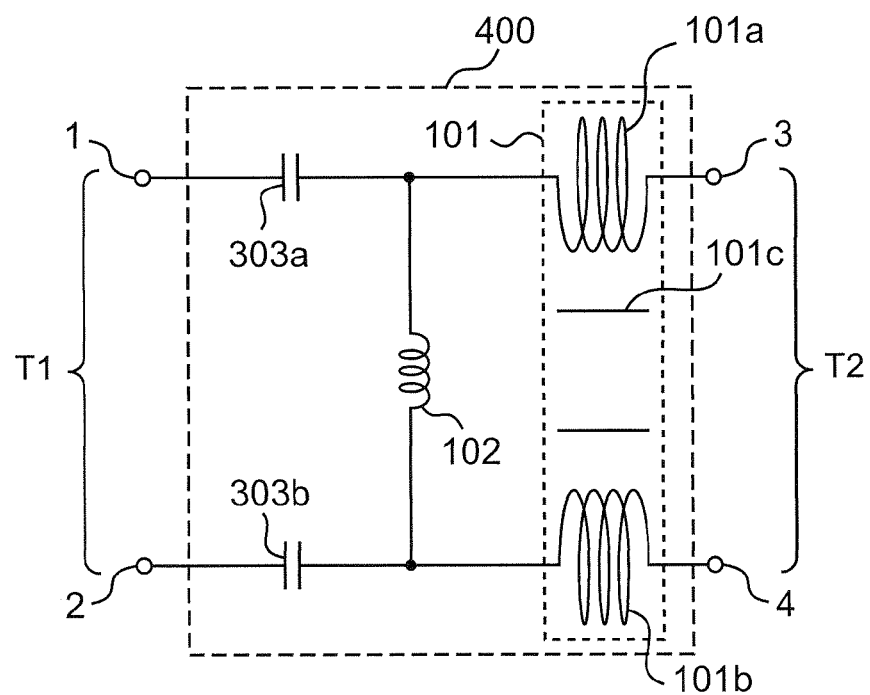
FIG. 4 is a circuit diagram showing a configuration of a common mode filter 400 according to a fourth embodiment of the present disclosure.

FIG. 4 is a circuit diagram showing a configuration of a common mode filter 400 according to the fourth embodiment of the present disclosure. Referring to FIG. 4, as compared with the common mode filter 330 of the third embodiment of FIG. 3, the common mode filter 400 of the present embodiment is characterized in that the inductor 102 of FIG. 1 is added.

Figure 16A:
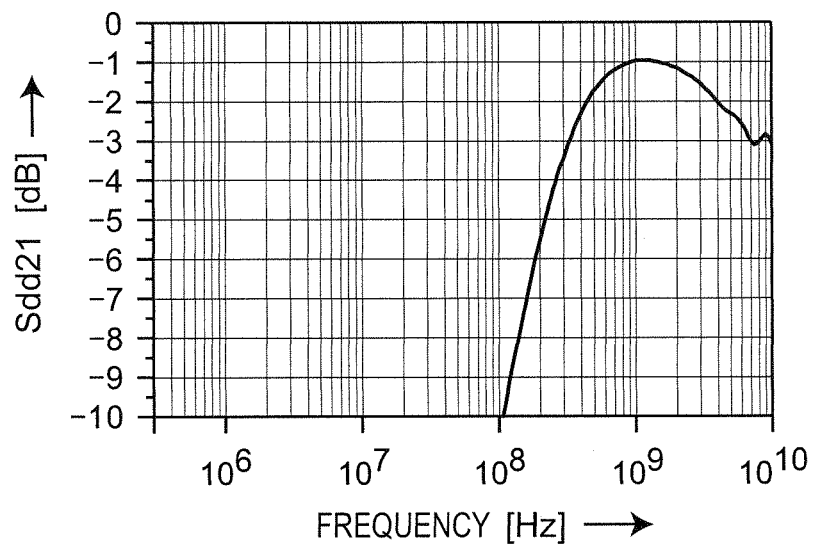
FIG. 16A is a spectral graph showing a frequency characteristic of the differential mode transmission coefficient Sdd21 of the common mode filter 300 of FIG. 3.
Figure 16B:
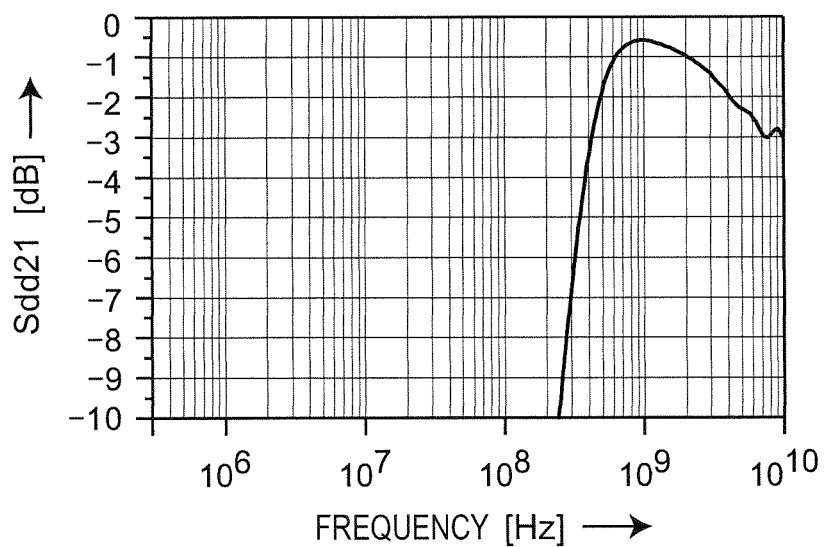
FIG. 16B is a spectral graph showing a frequency characteristic of the differential mode transmission coefficient Sdd21 of the common mode filter 400 of FIG. 4.

FIG. 16A is a spectral graph showing a frequency characteristic of the differential mode transmission coefficient Sdd21 of the common mode filter 300 of FIG. 3, and FIG. 16B is a spectral graph showing a frequency characteristic of the differential mode transmission coefficient Sdd21 of the common mode filter 400 of FIG. 4. As apparent from FIG. 16B, it can be understood that the gradually attenuated characteristic at the frequency equal to or lower than 1.5 GHz is shifted to a higher region side than that of FIG. 16A.

As described above, according to the present embodiment, it is possible to adjust the equalizing characteristic, and the de-emphasis curve can be changed so as to shift to the higher region side in the frequency band of the transmitted differential signal.

It is noted that the common mode filters 101, the inductors 102 and the capacitors 303a and 303b are not limited in number to the aforementioned numbers, and it is beneficial to provide a plurality of same elements connected in parallel or serial and change the constants of them.

Fifth Embodiment

Figure 5:
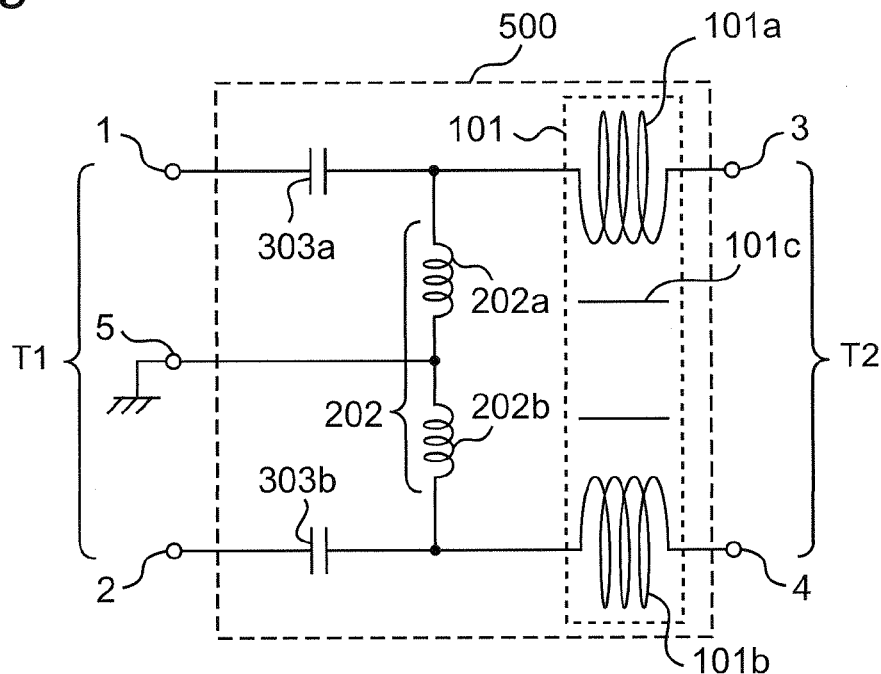
FIG. 5 is a circuit diagram showing a configuration of a common mode filter 500 according to a fifth embodiment of the present disclosure.

FIG. 5 is a circuit diagram showing a configuration of a common mode filter 500 according to the fifth embodiment of the present disclosure. Referring to FIG. 5, the common mode filter 500 of the present embodiment is characterized in that the inductor 102 is divided into two inductors 202a and 202b, and a grounded external terminal 5 is connected to the connection point of them in a manner similar to that of the third embodiment of FIG. 2 as compared with the common mode filter 400 of the fourth embodiment of FIG. 4.

Figure 17A:
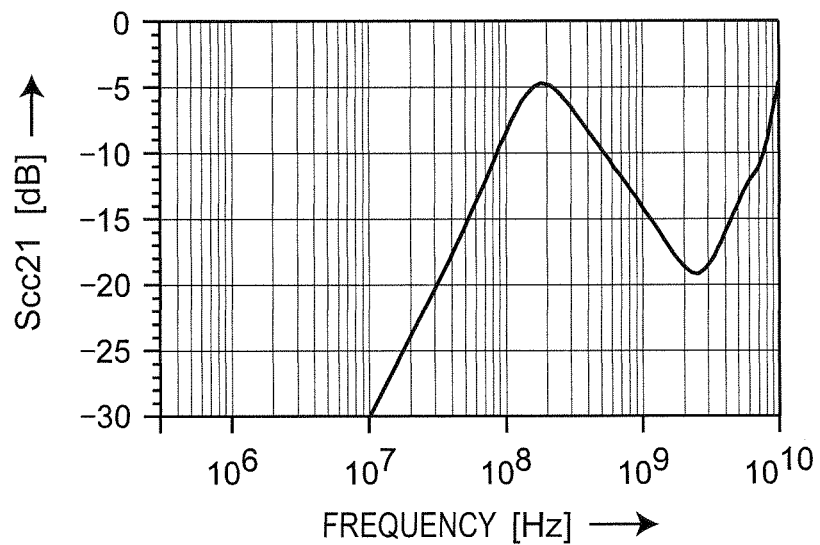
FIG. 17A is a spectral graph showing a frequency characteristic of the common mode transmission coefficient Sdd21 of the common mode filter 400 of FIG. 4.
Figure 17B:
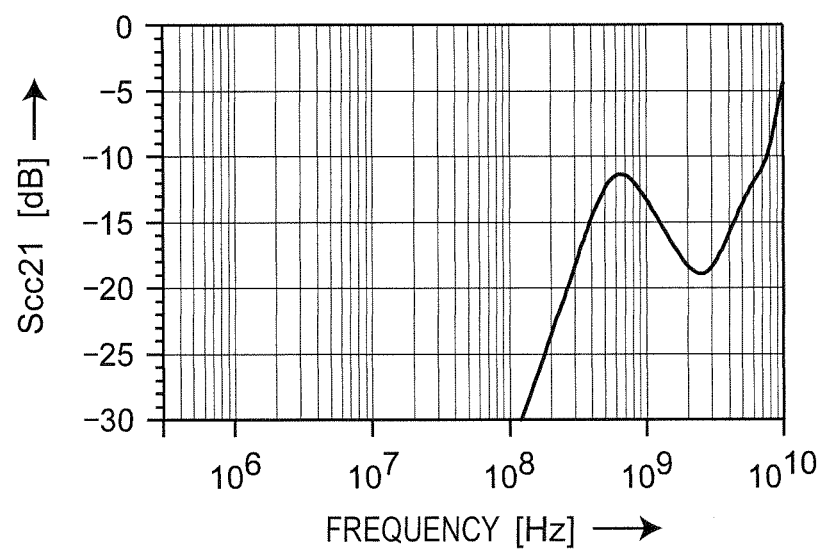
FIG. 17B is a spectral graph showing a frequency characteristic of the common mode transmission coefficient Scc21 of the common mode filter 500 of FIG. 5.

FIG. 17A is a spectral graph showing a frequency characteristic of the common mode transmission coefficient Sdd21 of the common mode filter 400 of FIG. 4, and FIG. 17B is a spectral graph showing a frequency characteristic of the common mode transmission coefficient Scc21 of the common mode filter 500 of FIG. 5. As apparent from FIG. 17B, it can be understood that removal capability of the common mode noise is further improved than that of FIG. 17A.

As described above, according to the present embodiment, it is possible to further improve removal capability of the common mode noise in a lower region than that of the second embodiment of FIG. 14B.

It is noted that the common mode filters 101, the inductors 202a and 202b, and the capacitors 303a and 303b are not limited in number to the aforementioned numbers, and it is beneficial to provide a plurality of same elements connected in serial or parallel and change the constants of them. Moreover, it is beneficial to provide a plurality of external terminals 5 and directly or indirectly ground the external terminal 5 as described above.

Sixth Embodiment

Figure 6:
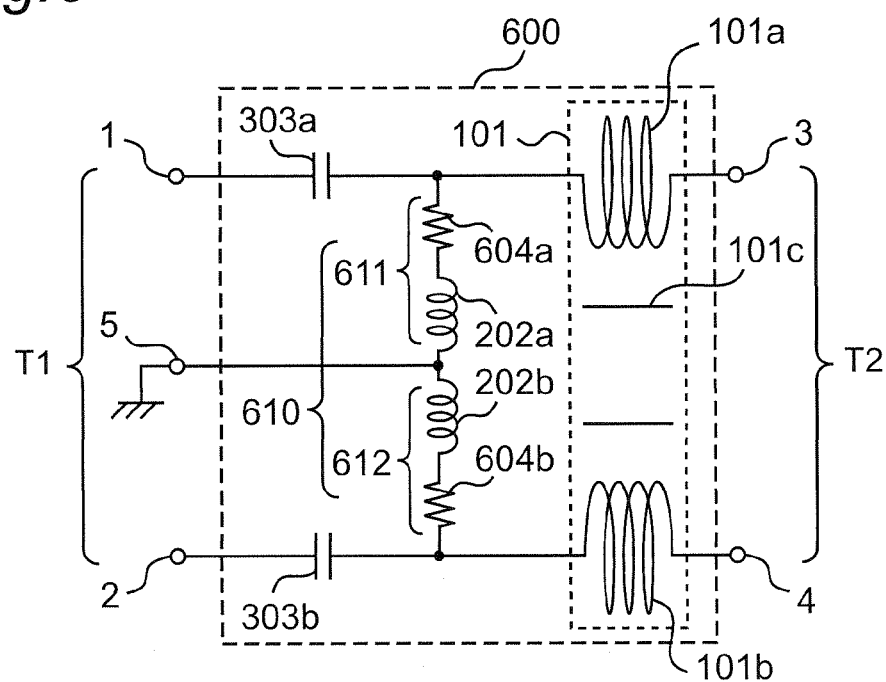
FIG. 6 is a circuit diagram showing a configuration of a common mode filter 600 according to a sixth embodiment of the present disclosure.

FIG. 6 is a circuit diagram showing a configuration of a common mode filter 600 according to the sixth embodiment of the present disclosure. Referring to FIG. 6, as compared with the fifth embodiment of FIG. 5, the common mode filter 600 of the present embodiment is characterized in that:

(1) the inductor 202a is replaced by a reactance circuit 611 configured to include a series circuit of a resistor 604a and an inductor 202a, i.e., the resistor 604a is further added, and (2) the inductor 202b is replaced by a reactance circuit 612 configured to include a series circuit of a resistor 604b and an inductor 202b, i.e., the resistor 604b is further added. In this case, the reactance circuits 611 and 612 constitute a reactance circuit 610.

Figure 18A:
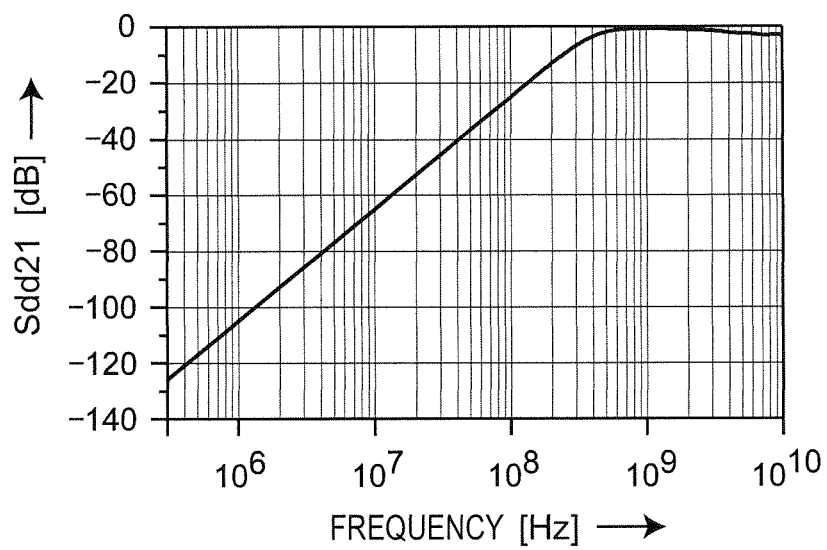
FIG. 18A is a spectral graph showing a frequency characteristic of the differential mode transmission coefficient Sdd21 of the common mode filter for the 64B66B coding system of FIG. 5.
Figure 18B:
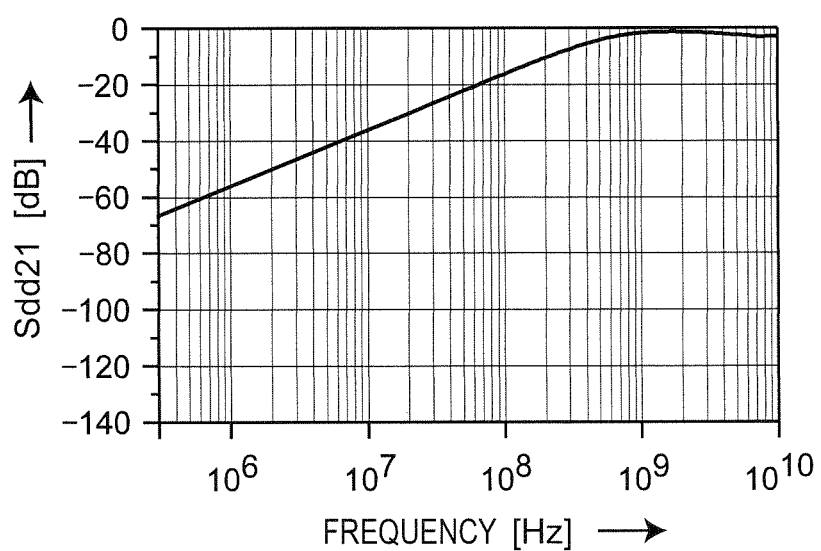
FIG. 18B is a spectral graph showing a frequency characteristic of the differential mode transmission coefficient Sdd21 of the common mode filter for the 64B66B coding system of FIG. 6.

FIG. 18A is a spectral graph showing a frequency characteristic of the differential mode transmission coefficient Sdd21 of a common mode filter for the 64B66B coding system of FIG. 5, and FIG. 18B is a spectral graph showing a frequency characteristic of the differential mode transmission coefficient Sdd21 of a common mode filter for the 64B66B coding system of FIG. 6. As apparent from FIG. 18B, it can be understood that the gradually attenuated characteristic at the frequency equal to or lower than 1.5 GHz is shifted to a lower region side than that of FIG. 18A.

As described above, according to the present embodiment, it is possible to further adjust the equalizing characteristic in the low region in the fifth embodiment, and the de-emphasis curve can be changed in the frequency band of the transmitted differential signal.

It is noted that the common mode filter 101, the inductors 202a and 202b, the capacitors 303a and 303b, and the resistors 604a and 604b are not limited in number to the aforementioned numbers, and it is beneficial to provide a plurality of same elements connected in parallel or series and change the constants of them. Moreover, it is beneficial to provide a plurality of external terminals 5 and directly or indirectly ground the external terminal 5 as described above. Further, the order of connection of the resistor 604a and the inductor 202a in the relevant series circuit and the order of connection of the resistor 604b and the inductor 202b in the relevant series circuit may be reversed to those in FIG. 6.

Seventh Embodiment

Figure 7:
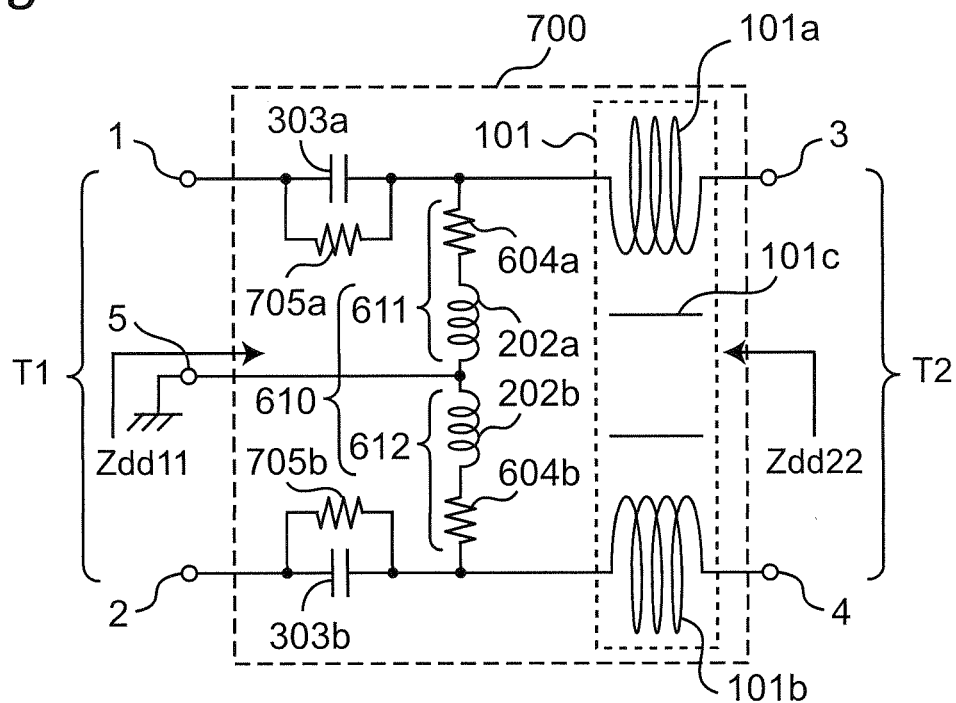
FIG. 7 is a circuit diagram showing a configuration of a common mode filter 700 according to a seventh embodiment of the present disclosure.

FIG. 7 is a circuit diagram showing a configuration of a common mode filter 700 according to the seventh embodiment of the present disclosure. Referring to FIG. 7, as compared with the common mode filter 600 of the sixth embodiment of FIG. 6, the common mode filter 700 of the present embodiment is characterized in that:

(1) the capacitor 303a is replaced by a parallel circuit of a resistor 705a and the capacitor 303a, i.e., the resistor 705a is further added, and (2) the capacitor 303b is replaced by a parallel circuit of a resistor 705b and the capacitor 303b, i.e., the resistor 705b is further added.

Figure 19A:
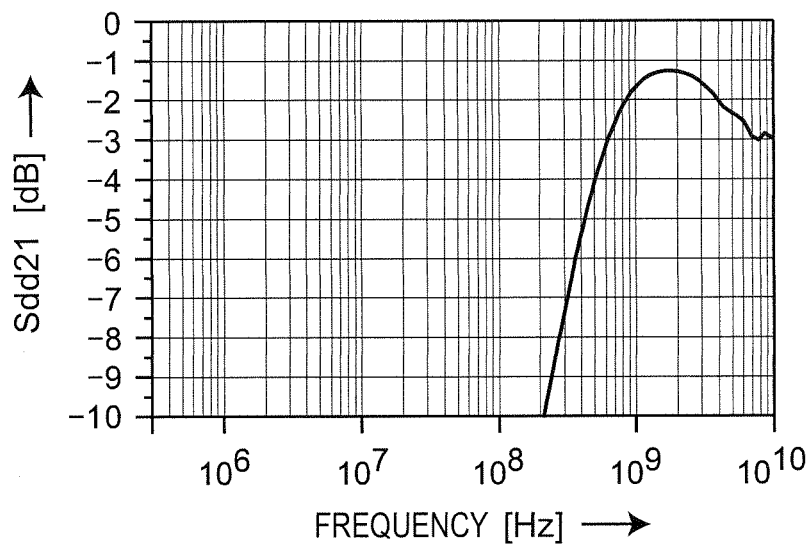
FIG. 19A is a spectral graph showing a frequency characteristic of the differential mode transmission coefficient Sdd21 of the common mode filter 600 of FIG. 6.
Figure 19B:
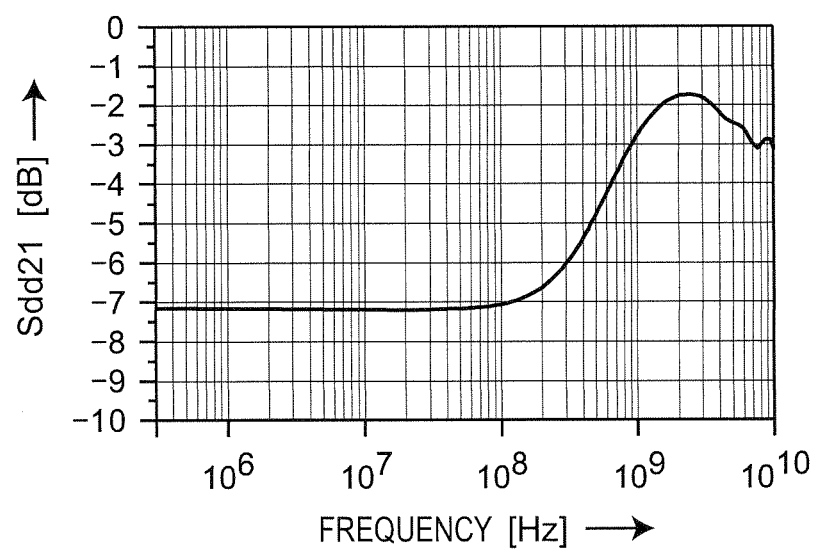
FIG. 19B is a spectral graph showing a frequency characteristic of the differential mode transmission coefficient Sdd21 of the common mode filter 700 of FIG. 7.

FIG. 19A is a spectral graph showing a frequency characteristic of the differential mode transmission coefficient Sdd21 of the common mode filter 600 of FIG. 6, and FIG. 19B is a spectral graph showing a frequency characteristic of the differential mode transmission coefficient Sdd21 of the common mode filter 700 of FIG. 7. As apparent from FIG. 19B, it can be understood that the characteristic at a frequency equal to or lower than 100 MHz is kept constant as compared with FIG. 19A. As a result, a worst attenuation amount is guaranteed for any data bit string regardless of the data coded by the 8B10B coding system or the like described in the first embodiment, therefore making it possible to use the filter in a wide variety of applications.

Figure 20A:
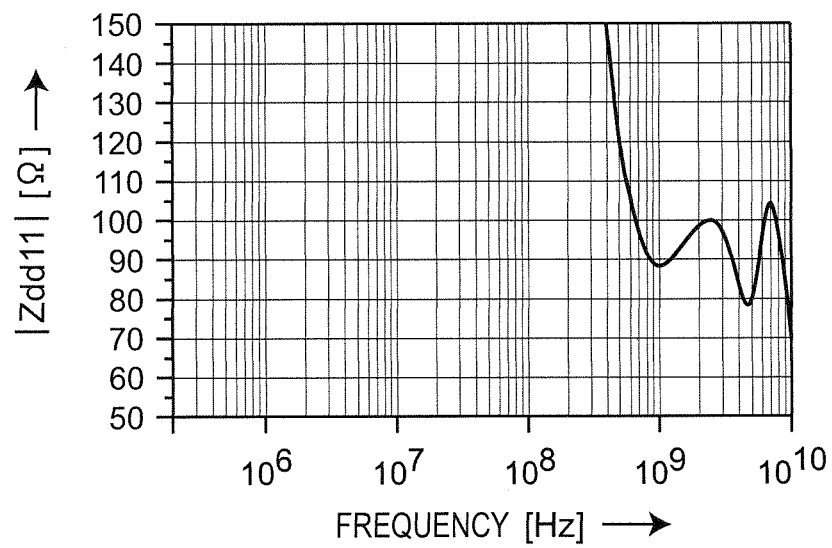
FIG. 20A is a spectral graph showing a frequency characteristic of the magnitude |Zdd11| of a differential mode impedance when the filter is viewed from the external terminal pair T1 of the common mode filter 600 of FIG. 6.
Figure 20B:
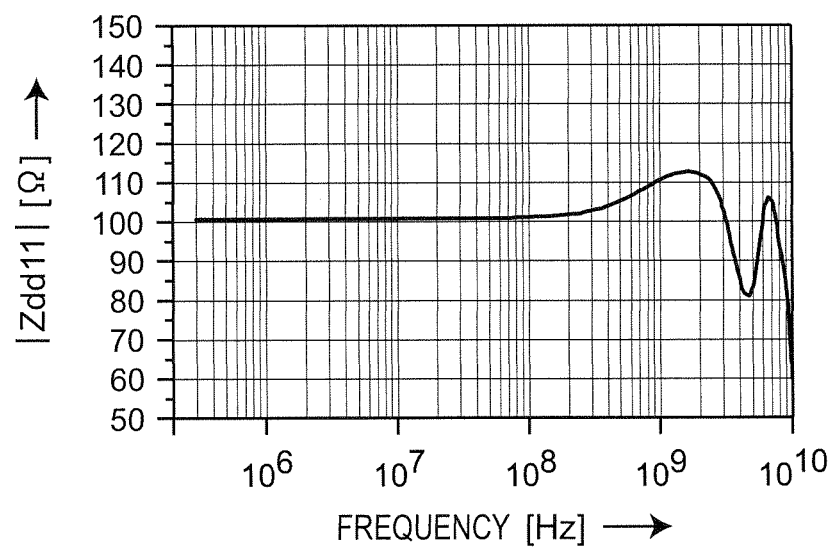
FIG. 20B is a spectral graph showing a frequency characteristic of the magnitude |Zdd11| of a differential mode impedance when the filter is viewed from the external terminal pair T1 of the common mode filter 700 of FIG. 7.

FIG. 20A is a spectral graph showing a frequency characteristic of the magnitude |Zdd11| of the differential mode impedance when the filter is viewed from the external terminal pair T1 of the common mode filter 600 of FIG. 6. FIG. 20B is a spectral graph showing a frequency characteristic of the magnitude |Zdd11| of the differential mode impedance when the filter is viewed from the external terminal pair T1 of the common mode filter 700 of FIG. 7. In contrast to the fact that impedance matching has not conventionally been achieved at a frequency equal to or lower than 500 MHz, matching is achieved at 100Ω in the present embodiment. No unnecessary signal reflection occurs, and radiation noises attributed to it are also suppressed. Moreover, it can be understood that a reduction in the noise immunity due to multipath reflections can be reduced. Moreover, no problem occurs even when the transmitted signal speed is reduced.

As described above, according to the present embodiment, it is possible to keep the differential transmission characteristic at a constant level further in the low region in the sixth embodiment, allowing impedance matching to be achieved from one direction.

It is noted that the common mode filter 101, the inductors 202a and 202b, the capacitors 303a and 303b, the resistors 604a, 604b, 705a and 705b are not limited in number to the aforementioned numbers. A plurality of same elements connected in parallel or serial may be provided, and the constants of them may be changed. Moreover, it is beneficial to provide a plurality of external terminals 5 and directly or indirectly ground the external terminal 5 as described above. Further, the order of connection of the resistor 604a and the inductor 202a in the relevant series circuit and the order of connection of the resistor 604b and the inductor 202b in the relevant series circuit may be reversed to those in FIG. 7.

Eighth Embodiment

Figure 8:
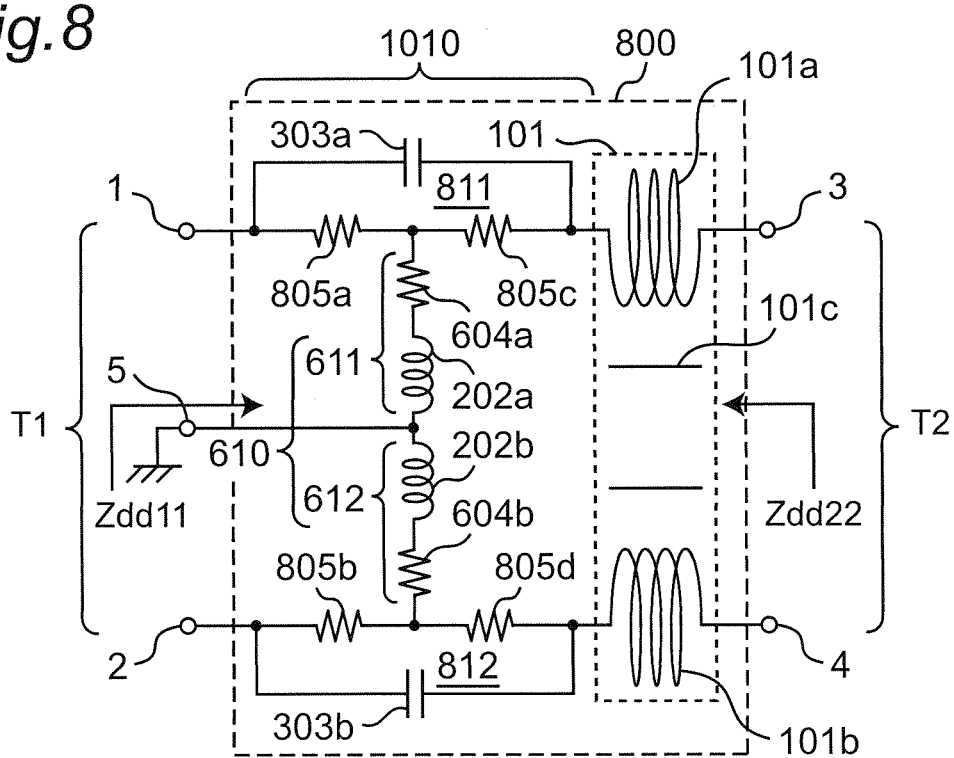
FIG. 8 is a circuit diagram showing a configuration of a common mode filter 800 according to an eighth embodiment of the present disclosure.

FIG. 8 is a circuit diagram showing a configuration of a common mode filter 800 according to the eighth embodiment of the present disclosure. As compared with the common mode filter 600 of the sixth embodiment of FIG. 6, the common mode filter 800 of the present embodiment is characterized in that (1) the capacitor 303a is replaced by a reactance circuit 811 configured to include a parallel circuit of a series circuit of two resistors 805a and 805c and a capacitor 303a, where the connection point of two resistors 805a and 805c is connected to one end of a resistor 604a, and (2) the capacitor 303b is replaced by a reactance circuit 812 configured to include a parallel circuit of a series circuit of two resistors 805b and 805d and a capacitor 303b, where the connection point of the two resistors 805b and 805d is connected to one end of a resistor 604b. In this case, a circuit configured to include the resistors 604a, 604b, and 805a to 805d, the inductors 202a and 202b, and the capacitors 303a and 303b is hereinafter referred to as a filter circuit 1010.

Figure 21A:
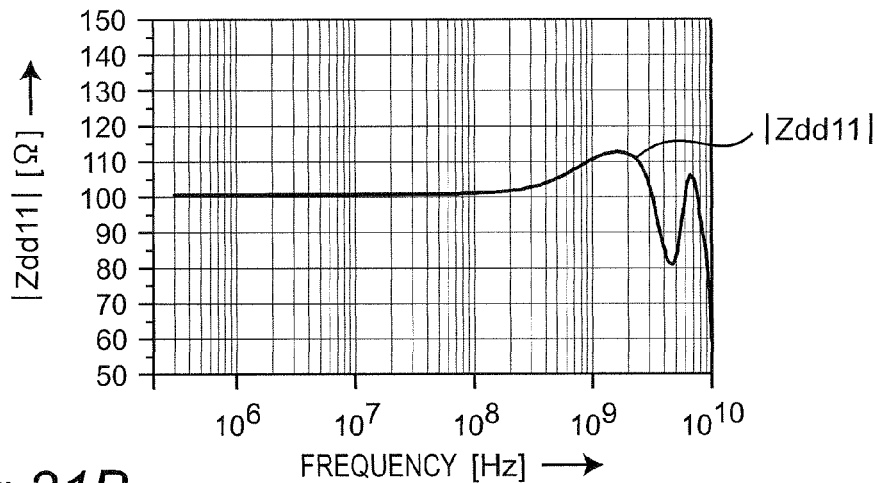
FIG. 21A is a spectral graph showing a frequency characteristic of the magnitude |Zdd11| of the differential mode impedance when the filter is viewed from the external terminal pair T1 of the common mode filter 700 of FIG. 7.
Figure 21B:
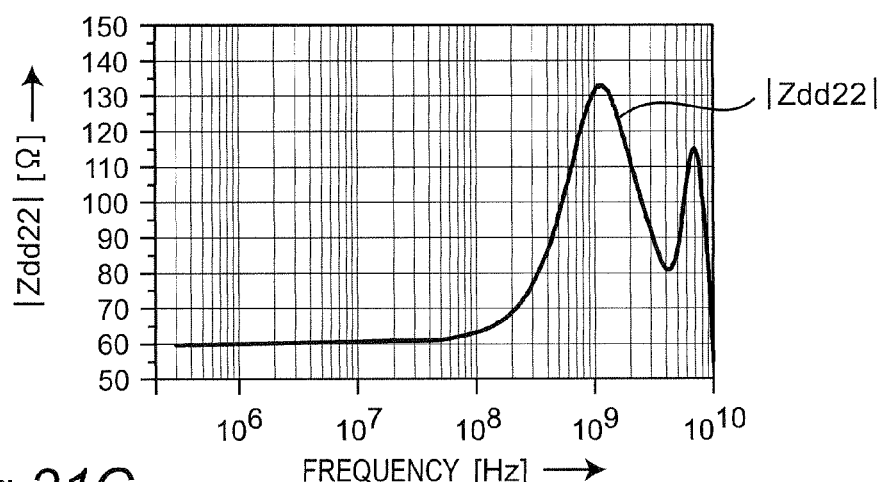
FIG. 21B is a spectral graph showing a frequency characteristic of the magnitude |Zdd22| of the differential mode impedance when the filter is viewed from the external terminal pair T2 of the common mode filter 700 of FIG. 7.
Figure 21C:
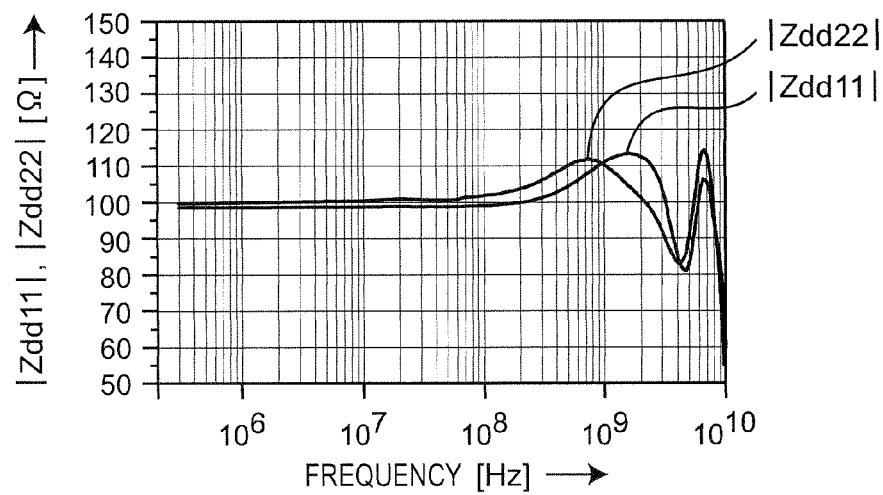
FIG. 21C is a spectral graph showing frequency characteristics of the magnitudes |Zdd11| and |Zdd22| of the differential mode impedances when the filter is viewed from the external terminal pairs T1 and T2 of the common mode filter 800 of FIG. 8.

FIG. 21A is a spectral graph showing a frequency characteristic of the magnitude |Zdd11| of the differential mode impedance when the filter is viewed from the external terminal pair T1 of the common mode filter 700 of FIG. 7. FIG. 21B is a spectral graph showing a frequency characteristic of the magnitude |Zdd22| of the differential mode impedance when the filter is viewed from the external terminal pair T2 of the common mode filter 700 of FIG. 7. FIG. 21C is a spectral graph showing frequency characteristics of the magnitudes |Zdd11| and |Zdd22| of the differential mode impedance when the filter is viewed from the external terminal pairs T1 and T2 of the common mode filter 800 of FIG. 8. In contrast to the fact that impedance matching is achieved only from the external terminal pair T1 in the seventh embodiment of FIGS. 21A and 21B, it can be understood that uniform impedance matching is achieved from both of the external terminal pairs T1 and T2 in the present embodiment of FIG. 21C.

As described above, according to the present embodiment, impedance matching can be achieved further from both directions in the seventh embodiment.

It is noted that the common mode filter 101, the inductors 202a and 202b, the capacitors 303a and 303b, the resistors 604a, 604b, and 805a to 805d are not limited in number to the aforementioned numbers. A plurality of same elements connected in parallel or serial may be provided, and the constants of then may be changed. Moreover, it is beneficial to provide a plurality of external terminals 5 and directly or indirectly ground the external terminal 5 as described above. Further, the order of connection of the resistor 604a and the inductor 202a in the relevant series circuit and the order of connection of the resistor 604b and the inductor 202b in the relevant series circuit may be reversed to those in FIG. 8.

Ninth Embodiment

Figure 9:
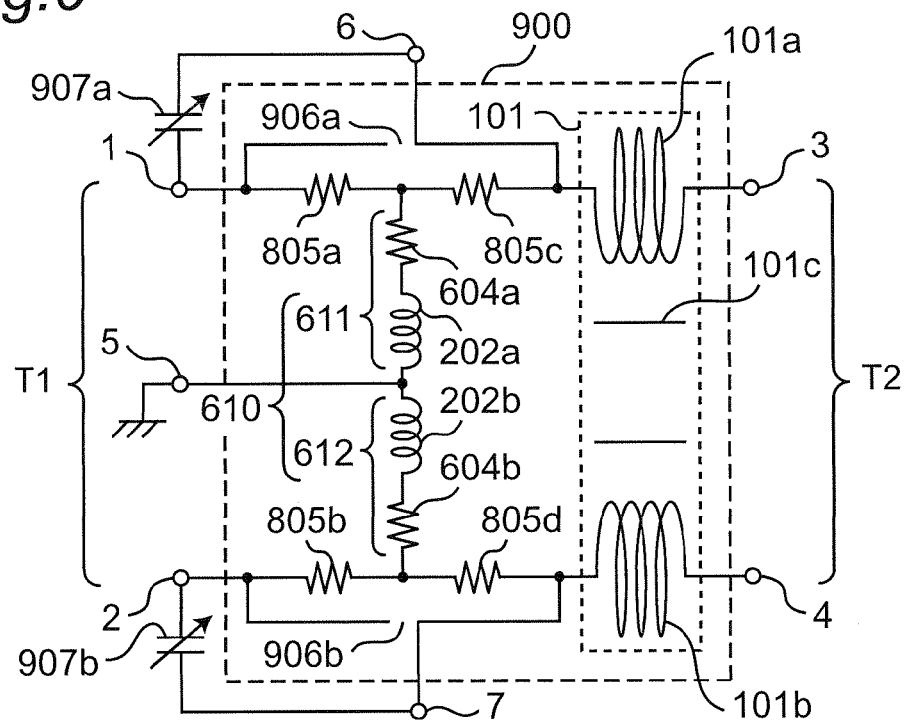
FIG. 9 is a circuit diagram showing a configuration of a common mode filter 900 according to a ninth embodiment of the present disclosure.

FIG. 9 is a circuit diagram showing a configuration of a common mode filter 900 according to the ninth embodiment of the present disclosure. Referring to FIG. 9, as compared with the common mode filter 800 of the eighth embodiment of FIG. 8, the common mode filter 900 of the present embodiment is characterized in that (1) an open portion 906a is formed by removing the capacitor 303a to make an open state, and one end (connected to one end of the coil 101a of the common mode filter 101) of the open portion 906a is connected to an external terminal 6, and (2) an open portion 906b is formed by removing the capacitor 303b to make an open state, and one end (connected to one end of the coil 101b of the common mode filter 101) of the open portion 906b is connected to an external terminal 7.

In this case, the filter is characterized in that a variable capacitor 907a is preferably connected between the external terminals 1 and 6, a variable capacitor 907b is preferably connected between the external terminals 2 and 7, and the equalizing characteristic is adjusted by changing the capacitances of these variable capacitors 907a and 907b.

Tenth Embodiment

Figure 10:
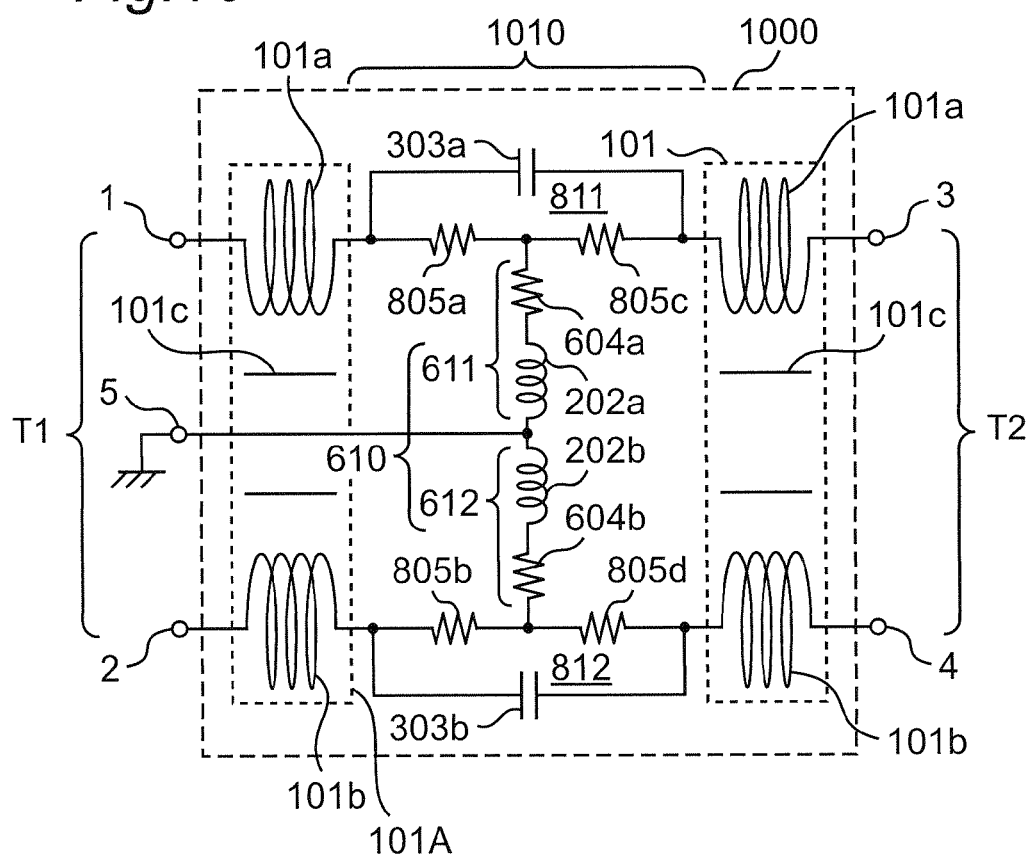
FIG. 10 is a circuit diagram showing a configuration of a common mode filter 1000 according to a tenth embodiment of the present disclosure.

FIG. 10 is a circuit diagram showing a configuration of a common mode filter 1000 according to the tenth embodiment of the present disclosure. Referring to FIG. 10, as compared with the common mode filter 800 of FIG. 8, the common mode filter 1000 of the present embodiment is characterized in that a common mode filter portion 101A having a configuration similar to that of the common mode filter portion 101 is also inserted between one end of the resistor 805a and the external terminal 1 and between one end of the resistor 805b and the external terminal 2, i.e., the common mode filter portions 101 and 101A are inserted on both sides of a filter circuit 1010 configured to include the resistors 604a, 604b, and 805a to 805d, the inductors 202a and 202b, and the capacitors 303a and 303b. That is, the filter is characterized in that the common mode filter portions 101 and 101A are placed on both the external terminal pairs. T1 and T2 sides.

Figure 22A:
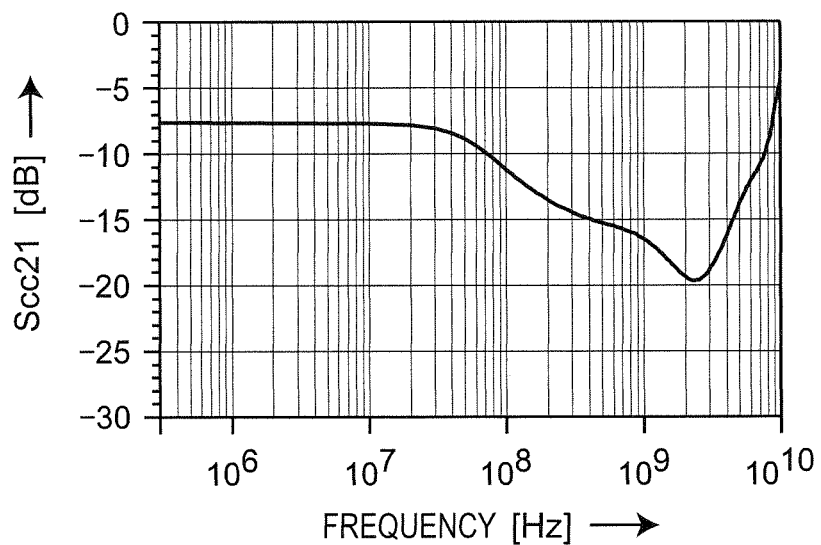
FIG. 22A is a spectral graph showing a frequency characteristic of the common mode transmission coefficient Scc21 of the common mode filter 800 of FIG. 8.
Figure 22B:
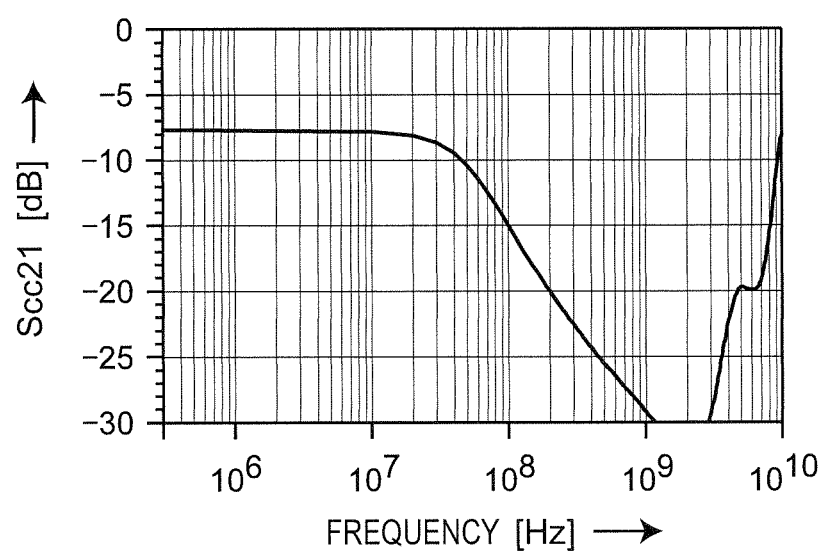
FIG. 22B is a spectral graph showing a frequency characteristic of the common mode transmission coefficient Scc21 of the common mode filter 1000 of FIG. 10.

FIG. 22A is a spectral graph showing a frequency characteristic of the common mode transmission coefficient Scc21 of the common mode filter 800 of FIG. 8, and FIG. 22B is a spectral graph showing a frequency characteristic of the common mode transmission coefficient Scc21 of the common mode filter 1000 of FIG. 10. As apparent from FIG. 22B, it can be understood that removal capability of the common mode noise in the high region is improved as compared with FIG. 22A. Moreover, by virtue of the laterally symmetrical structure, a more uniform characteristic can be obtained regardless of the directional relations of the components.

As described above, according to the present embodiment, removal capability of the common mode noise in the high region can be further improved. Moreover, by virtue of the laterally symmetrical structure, a more uniform characteristic can be obtained regardless of the directional relations of the components.

Eleventh Embodiment

Figure 11:
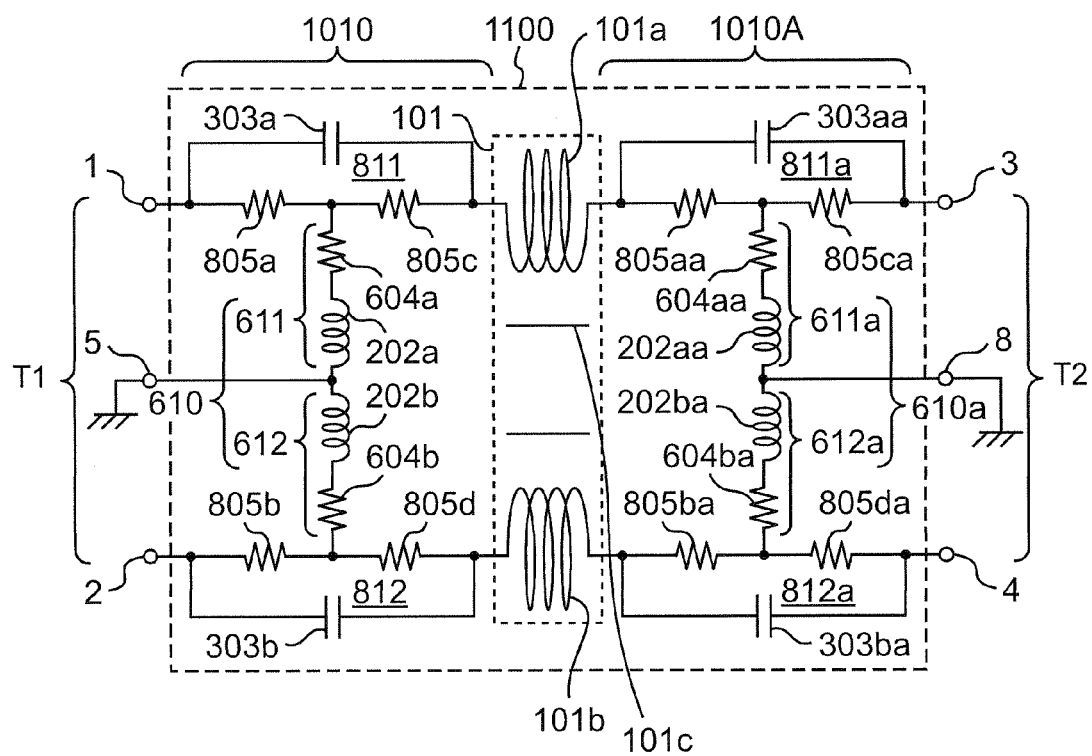
FIG. 11 is a circuit diagram showing a configuration of a common mode filter 1100 according to an eleventh embodiment of the present disclosure.

FIG. 11 is a circuit diagram showing a configuration of a common mode filter 1100 according to the eleventh embodiment of the present disclosure. Referring to FIG. 11, as compared with the common mode filter 800 of the eighth embodiment of FIG. 8, the common mode filter 1100 of the present embodiment is characterized in that a common mode filter portion 1010A having a circuit configuration similar to that of the filter portion 1010 is inserted between the common mode filter portion 101 and the external terminal T2. In this case, the filter circuit 1010A is constituted of resistors 604aa, 604ba, 805aa to 805da, inductors 202aa and 202ba, and capacitors 303aa and 303ba.

In the filter circuit 1010A of FIG. 11, a reactance circuit 611a is configured to include the resistor 604aa and the inductor 202aa, a reactance circuit 612a is configured to include the resistor 604ba and the inductor 202ba, and a reactance circuit 610a is configured to include the reactance circuits 611a and 612a. Moreover, a reactance circuit 811a is configured to include the resistors 805aa and 805ca and the capacitor 303aa, and a reactance circuit 812a is configured to include the resistors 805ba and 805da and the capacitor 303ba. It is noted that the connection point of the inductor 202aa and the inductor 202ba is connected to an external terminal 8.

According to the common mode filter 1100 configured as above, removal capability of the common mode noise in the low region can be further improved than that of the eighth embodiment of FIG. 8. Moreover, by virtue of the laterally symmetrical structure, a more uniform characteristic can be obtained regardless of the directional relations of the components.

Although the common mode filters 100 to 1100 have been described in the aforementioned embodiments, these common mode filters 100 to 1100 may be constituted by being provided for high-speed serial interface circuits such as HDMI (High Definition Multi-media Interface) and USB (Universal Serial Bus).

Examples of the disclosed technique are as follows.

According to the first aspect of the disclosure, there is provided a common mode filter including at least one common mode filter portion configured to remove a common mode noise, and the at least one common mode filter portion has a first terminal pair configured to include first and second terminals connected to first and second external terminals, respectively, and has a second terminal pair configured to include third and fourth terminals connected to third and fourth external terminals, respectively.

The common mode filter includes an inductor circuit, and a fifth external terminal. The inductor circuit includes at least first and second inductors that are connected in parallel to the first terminal pair of the common mode filter portion and are connected in series to each other. The fifth external terminal is connected to a connection point of the first and second inductors. The fifth external terminal is for being directly or indirectly grounded.

According to the second aspect of the disclosure, the common mode filter of the first aspect of the disclosure further includes first and second capacitors. The first capacitor is inserted between the first external terminal and the first terminal of the common mode filter portion. The second capacitor is inserted between the second external terminal and the second terminal of the common mode filter portion.

According to the third aspect of the disclosure, the common mode filter of the second aspect of the disclosure further includes first and second resistors. The first resistor is inserted between the first terminal of the common mode filter portion and one end of the first inductor or between a connection point of the first and second inductors and the other end of the first inductor. The second resistor is inserted between the second terminal of the common mode filter portion and one end of the second inductor or between a connection point of the first and second inductors and the other end of the second inductor.

According to the fourth aspect of the disclosure, the common mode filter of the third aspect of the disclosure further includes a third resistor connected in parallel to the first capacitor, and a fourth resistor connected in parallel to the second capacitor.

According to the fifth aspect of the disclosure, there is provided a common mode filter including at least one common mode filter portion configured to remove a common mode noise, and the at least one common mode has a first terminal pair configured to include first and second terminals connected to first and second external terminals, respectively, and has a second terminal pair configured to include third and fourth terminals connected to third and fourth external terminals, respectively.

The common mode filter includes a filter circuit connected between the first terminal pair of the common mode filter portion and the first and second external terminals. The filter circuit includes first, second, third and fourth reactance circuits. The first reactance circuit is connected between the first terminal of the common mode filter portion and the first external terminal, and the first reactance circuit is configured to include a parallel circuit of a series circuit of two resistors and a capacitor. The second reactance circuit is connected between the second terminal of the common mode filter portion and the second external terminal, and the second reactance circuit is configured to include a parallel circuit of a series circuit of two resistors and a capacitor. The third reactance circuit is connected between a connection point of the two resistors of the first reactance circuit and a fifth external terminal, and the third reactance circuit is configured to include a series circuit of a resistor and an inductor. The fourth reactance circuit is connected between a connection point of the two resistors of the second reactance circuit and the fifth external terminal, and the fourth reactance circuit is configured to include a series circuit of a resistor and an inductor. The fifth external terminal is for being directly or indirectly grounded.

According to the sixth aspect of the disclosure, the common mode filter of the fifth aspect of the disclosure further includes sixth and seventh external terminals, and first and second variable capacitors. The sixth external terminal is made by removing a capacitor of the first reactance circuit to form an open portion, and is connected to the first terminal of the common mode filter portion. The seventh external terminal is made by removing a capacitor of the first reactance circuit to form an open portion, and is connected to the second terminal of the common mode filter portion. The first variable capacitor is to be connected between the first external terminal and the sixth external terminal, and the second variable capacitor is to be connected between the second external terminal and the seventh external terminal.

According to the seventh aspect of the disclosure, the common mode filter of the fifth aspect of the disclosure further includes a further common mode filter portion, which has a configuration similar to that of the common mode filter portion and is inserted between the filter circuit and the first and second terminals.

According to the eighth aspect of the disclosure, the common mode filter of the fifth aspect of the disclosure further includes a further filter circuit, which has a configuration similar to that of the common mode filter portion and is inserted between the common mode filter and the third and fourth terminals.

Accordingly, since the common mode filter of the first aspect of the disclosure includes the grounded external terminal, there can be provided a path through which the common mode components go away, and it is further possible to heighten the removal capability of the low-band common mode noise in addition to the equalizing function.

In addition, since the common mode filter of the second aspect of the disclosure further includes the first capacitor which is inserted between the first external terminal and the first terminal of the common mode filter portion, and the second capacitor which is inserted between the second external terminal and the second terminal of the common mode filter portion, there can be simultaneously obtained such an effect as heightening the equalizing function and the removal capability of the low-band common mode noise, and also, it is possible to cut the DC component.

Further, since the common mode filter of the third aspect of the disclosure further includes first and second resistors, where the first resistor is inserted between the first terminal of the common mode filter portion and one end of the first inductor or between a connection point of the first and second inductors and the other end of the first inductor, and the second resistor is inserted between the second terminal of the common mode filter portion and one end of the second inductor or between a connection point of the first and second inductors and the other end of the second inductor. Then, it is possible to further adjust the low-band equalizing characteristics, and to change and shift the de-emphasis curve into the higher-band side in the frequency band of the differential signal to be transmitted.

Still further, since the common mode filter of the fourth aspect of the disclosure further includes the third resistor connected in parallel to the first capacitor, and the fourth resistor connected in parallel to the second capacitor. Then, it is possible to further maintain the low-band differential transmitting characteristics to be a constant level, and to make the impedance matching from one direction. In addition, this leads to no unnecessary signal reflection, and to suppress the projection noise due to this, and further, it is possible to reduce the lowering of the noise resistance properties due to multi-reflection. Further, there is no problem even when lowering the speed of the signal to be transmitted.

According to the fifth aspect of the disclosure, there is provided the common mode filter includes the filter circuit connected between the first terminal pair of the common mode filter portion and the first and second external terminals. The filter circuit includes first, second, third and fourth reactance circuits. The first reactance circuit is connected between the first terminal of the common mode filter portion and the first external terminal, and the first reactance circuit is configured to include a parallel circuit of a series circuit of two resistors and a capacitor. The second reactance circuit is connected between the second terminal of the common mode filter portion and the second external terminal, and the second reactance circuit is configured to include a parallel circuit of a series circuit of two resistors and a capacitor. The third reactance circuit is connected between a connection point of the two resistors of the first reactance circuit and a fifth external terminal, and the third reactance circuit is configured to include a series circuit of a resistor and an inductor. The fourth reactance circuit is connected between a connection point of the two resistors of the second reactance circuit and the fifth external terminal, and the fourth reactance circuit is configured to include a series circuit of a resistor and an inductor. The fifth external terminal is for being directly or indirectly grounded. Then, in addition to the above-mentioned actions and effects, it is possible to further make the impedance matching from both the directions.

In addition, the common mode filter of the sixth aspect of the disclosure further includes sixth and seventh external terminals, and first and second variable capacitors. The sixth external terminal is made by removing a capacitor of the first reactance circuit to form an open portion, and is connected to the first terminal of the common mode filter portion. The seventh external terminal is made by removing a capacitor of the first reactance circuit to form an open portion, and is connected to the second terminal of the common mode filter portion. The first variable capacitor is to be connected between the first external terminal and the sixth external terminal, and the second variable capacitor is to be connected between the second external terminal and the seventh external terminal. Then, adjusting of respective capacitance values of the first and second variable capacitors can adjust the equalizing characteristics of the common mode filter.

Further, the common mode filter of the seventh aspect of the disclosure further includes the further common mode filter portion, which has a configuration similar to that of the common mode filter portion and is inserted between the filter circuit and the first and second terminals. Namely, providing the common mode filter portion on both the sides of the filter circuit can further heighten the removal capability of the high-band common mode noise. In addition, because of right and left symmetric structure, there can further obtain a uniform characteristic to be independent of the directivity of the parts.

Still further, the common mode filter of the eighth aspect of the disclosure further includes the further filter circuit, which has a configuration similar to that of the common mode filter portion and is inserted between the common mode filter and the third and fourth terminals. Then, it is possible to further heighten the removal capability of the low-band common mode noise. In addition, because of right and left symmetric structure, there can further obtain a uniform characteristic to be independent of the directivity of the parts.

As described in detail above, according to the common mode filter of the present disclosure, the equalizing function is internally provided for the interface that transmits a differential signal. Therefore, the differential transmission waveform is corrected to allow the signal waveform to be easily transmitted, and removal capability of the common mode noise is remarkably improved. Moreover, since the impedance matching that gives no influence on the transmission waveform is also achieved, and therefore, no unnecessary signal reflection occurs. Radiation noises attributed to it are also suppressed, and the filter can be applied as means for suppressing the reduction in the noise immunity due to multipath reflections.

The common mode filter of the present disclosure can be applied, in particular, to high-speed serial interface circuits such as HDMI (High Definition Multi-media Interface) and USB (Universal Serial Bus).

With this arrangement, it is possible to further achieve impedance matching from both directions in addition to the aforementioned operational effects.

Although the present invention has been fully described in connection with the embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A common mode filter comprising:
at least one common mode filter portion configured to remove a common mode noise, the at least one common mode filter portion having a first terminal pair configured to include first and second terminals connected to first and second external terminals, respectively, and having a second terminal pair configured to include third and fourth terminals connected to third and fourth external terminals, respectively;
an inductor circuit including at least two inductors including a first and a second inductor that are connected in parallel to the first terminal pair of the at least one common mode filter portion and are connected in series to each other;
a fifth external terminal connected to a connection point of the first and second inductors;
a first capacitor inserted between the first external terminal and the first terminal of the at least one common mode filter portion;
a second capacitor inserted between the second external terminal and the second terminal of the at least one common mode filter portion;
a first discrete resistor inserted between the first terminal of the at least one common mode filter portion and one end of the first inductor or between the connection point of the first and second inductors and another end of the first inductor; and
a second discrete resistor inserted between the second terminal of the at least one common mode filter portion and one end of the second inductor or between the connection point of the first and second inductors and another end of the second inductor,
wherein the fifth external terminal is for being directly or indirectly grounded.

2. A common mode filter comprising:
   at least one common mode filter portion configured to remove a common mode noise, the at least one common mode filter portion having a first terminal pair including first and second terminals and a second terminal pair including third and fourth terminals;
   a first capacitor having a first end connected to the first terminal of the at least one common mode filter portion by a first conductor and a second end connected to a first external terminal by a second conductor;
   a second capacitor having a first end connected to the second terminal of the at least one common mode filter portion by a third conductor and a second end connected to a second external terminal by a fourth conductor;
   a first reactance circuit having a first resistor and a first inductor, a first end of the first resistor connected to a first end of the first inductor by a fifth conductor;
   a second reactance circuit having a second resistor and a second inductor, a first end of the second resistor connected to a first end of the second inductor by a sixth conductor,
   wherein one of a second end of the first resistor and a second end of the first inductor is connected to the first terminal of the at least one common mode filter portion by a seventh conductor, and another of the second end of the first resistor and the second end of the first inductor is connected to a connection point by an eighth conductor,
   wherein one of a second end of the second resistor and a second end of the second inductor is connected to the second terminal of the at least one common mode filter portion by a ninth conductor, and another of the second end of the second resistor and the second end of the second inductor is connected to the connection point by a tenth conductor,
   wherein the first and second inductors are connected in parallel to the first terminal pair of the at least one common mode filter portion and are connected in series to each other, and
   wherein the connection point is connected to a fifth external terminal by an eleventh conductor to be directly or indirectly grounded.

* * * * *